(12) United States Patent
Kurz

(10) Patent No.: US 7,229,018 B2
(45) Date of Patent: Jun. 12, 2007

(54) MANUFACTURE OF RFID TAGS AND INTERMEDIATE PRODUCTS THEREFOR

(76) Inventor: Arthur A. Kurz, Wildlife Run, New Vernon, NJ (US) 07976

( * ) Notice: Subject to any disclaimer, the term of this patent is extended or adjusted under 35 U.S.C. 154(b) by 6 days.

(21) Appl. No.: 11/191,381

(22) Filed: Jul. 28, 2005

(65) Prior Publication Data

US 2006/0026819 A1   Feb. 9, 2006

Related U.S. Application Data

(60) Provisional application No. 60/598,268, filed on Aug. 3, 2004.

(51) Int. Cl.
| | |
|---|---|
| G06K 19/06 | (2006.01) |
| G06K 7/06 | (2006.01) |
| H05K 5/02 | (2006.01) |
| H05K 7/18 | (2006.01) |
| H05K 3/00 | (2006.01) |
| H01Q 1/36 | (2006.01) |
| H01Q 17/00 | (2006.01) |
| G08R 31/28 | (2006.01) |

(52) U.S. Cl. ............... 235/441; 29/593; 29/829; 29/601; 343/895; 361/813; 235/492

(58) Field of Classification Search ........... 235/492; 29/593, 829, 601, 825, 827, 884, 832; 343/700, 343/895, 702; 361/813; 257/352
See application file for complete search history.

(56) References Cited

U.S. PATENT DOCUMENTS

| | | | | |
|---|---|---|---|---|
| 5,276,345 | A * | 1/1994 | Siegel et al. | 257/352 |
| 5,946,198 | A * | 8/1999 | Hoppe et al. | 361/813 |
| 6,419,525 | B1 * | 7/2002 | Heim et al. | 235/441 |
| 2002/0036237 | A1 * | 3/2002 | Atherton et al. | 235/492 |
| 2004/0093721 | A1 * | 5/2004 | Watson | 29/593 |
| 2005/0035924 | A1 * | 2/2005 | Liu et al. | 343/895 |

* cited by examiner

*Primary Examiner*—Michael G. Lee
*Assistant Examiner*—Thien T. Mai
(74) *Attorney, Agent, or Firm*—Arthur Jacob

(57) ABSTRACT

In the manufacture of RFID tags, electronic components are connected with soldered connections to antennas stamped from a thin strip of electrically conductive metal, utilizing methods and intermediate products which enable accurate registration of the leads of the electronic components with contacts on the antennas. Thus, a strip of metal is provided with contact members unitary with the strip and coupled to the strip through compliant coupling arrangements which allow compliant movement of the contact members relative to the strip for accurate alignment with electronic components juxtaposed with the contact members for soldered connections between the leads of the electronic components and the corresponding contact members. The antennas, with the electronic components soldered in place, are carried by a substrate, and the sequence of the stamping and soldering operations avoids exposing the substrate to the heat of soldering.

56 Claims, 4 Drawing Sheets

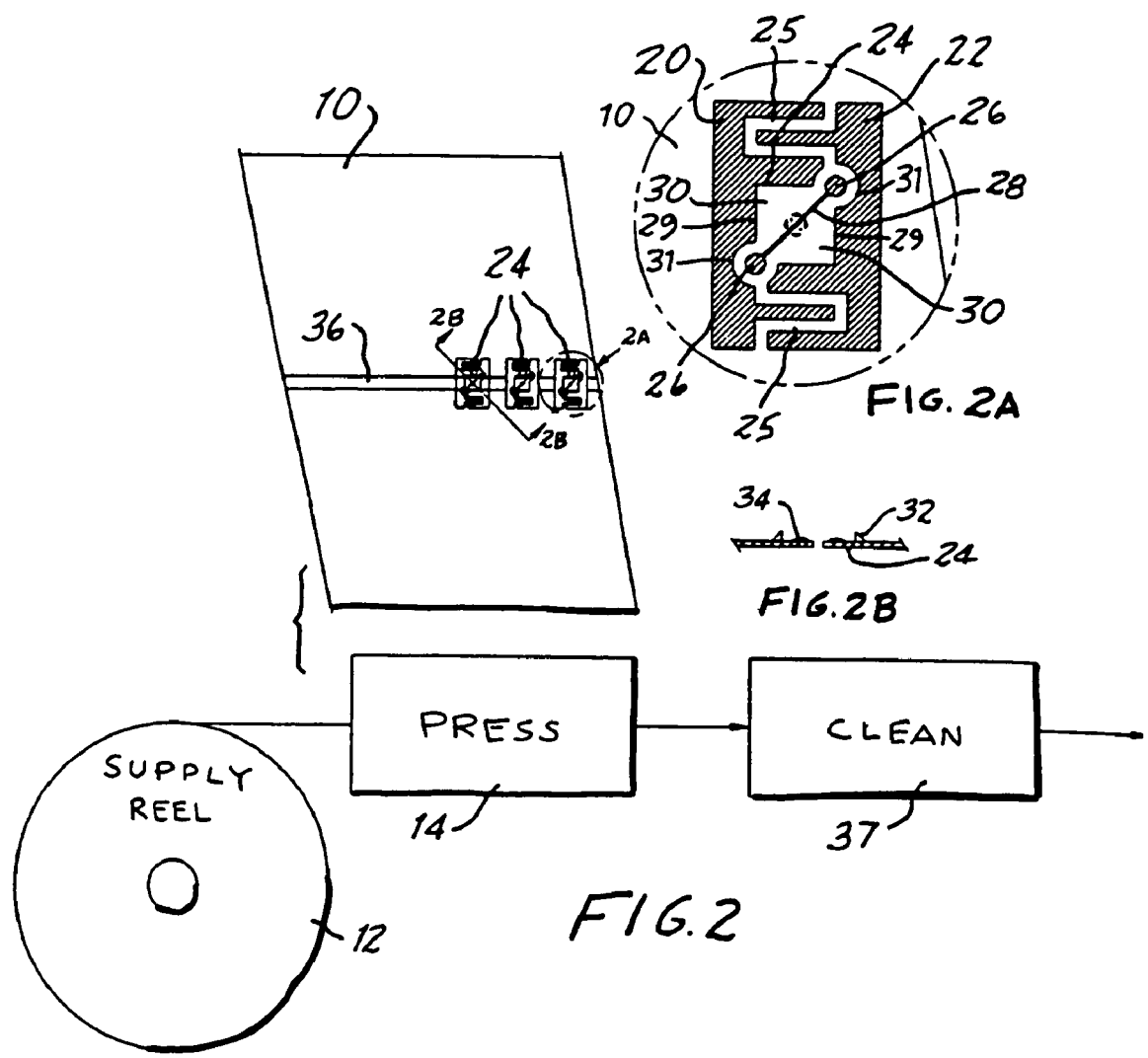

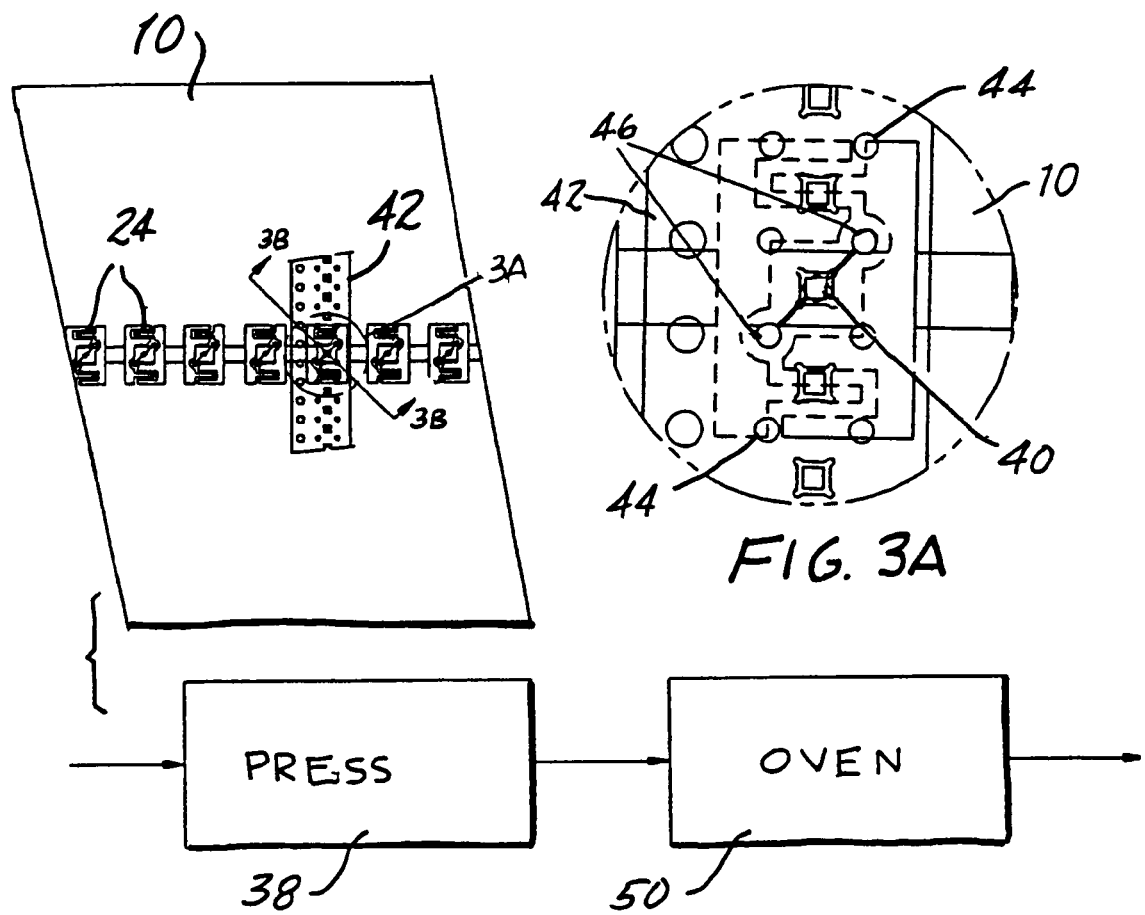
FIG. 3A
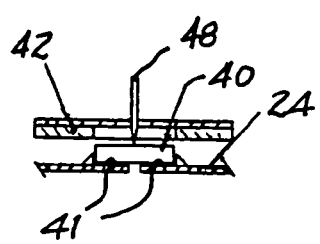
FIG. 3B
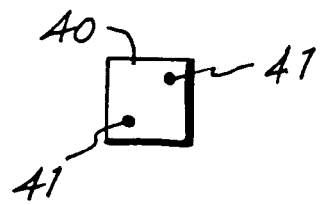
FIG. 3C
FIG. 3

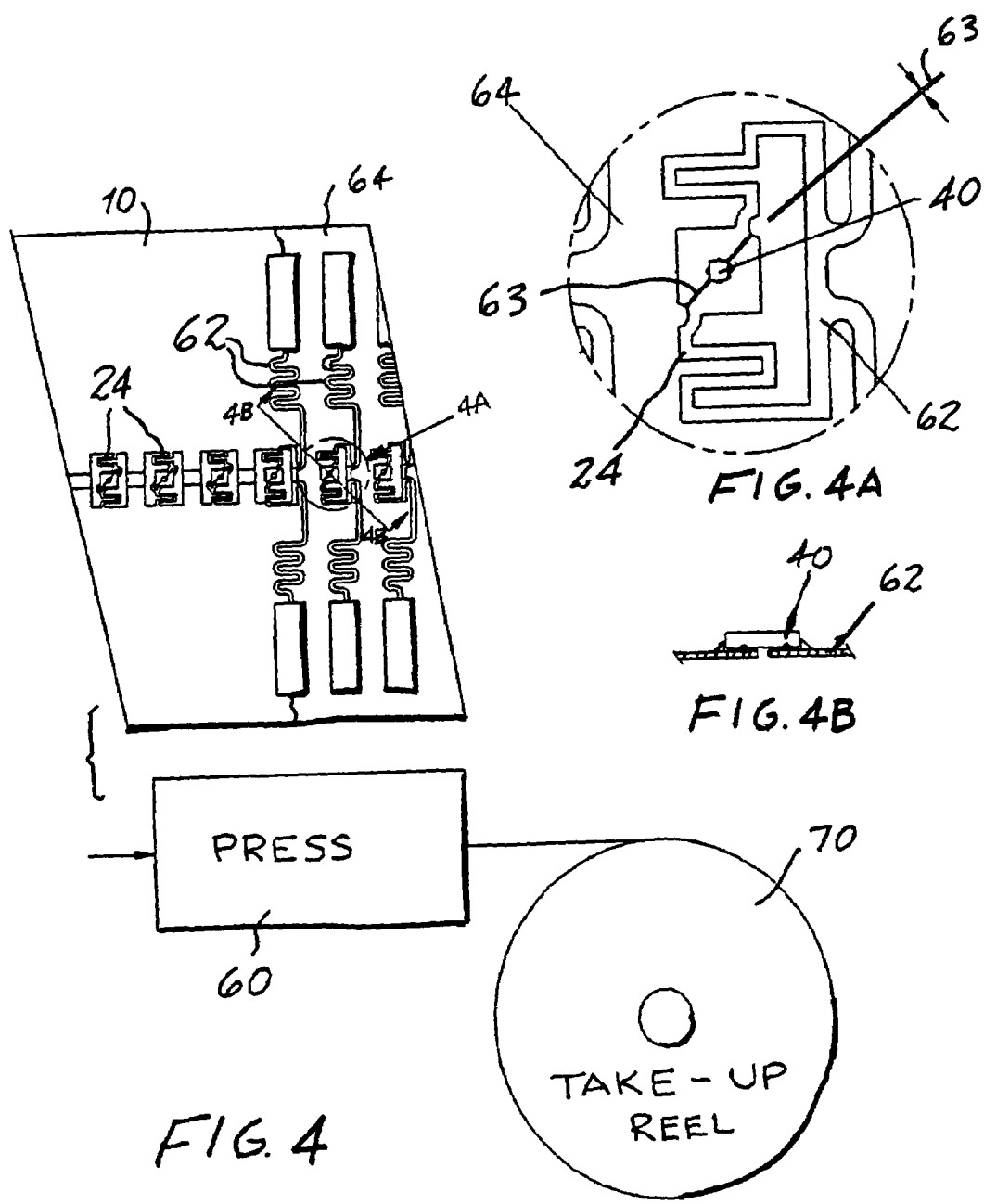

MANUFACTURE OF RFID TAGS AND INTERMEDIATE PRODUCTS THEREFOR

CROSS-REFERENCE TO RELATED APPLICATION

This application claims the benefit of provisional application Ser. No. 60/598,268, filed Aug. 3, 2004.

BACKGROUND OF THE INVENTION

1. Field of the Invention

The present invention relates generally to radio frequency identification (RFID) tags, or cards, and pertains, more specifically, to the manufacture of RFID tags and intermediate products employed in manufacturing processes for such tags.

RFID tags are finding increased and widespread use as more systems are developed and placed into service for managing the inventory and sale of a wider variety of goods. These RFID tags are applied to the goods and employ electronic circuitry responsive to radio frequency (RF) signals for providing readily monitored identification data pertaining to the goods. By virtue of the manner in which RFID tags are attached to and carried by various articles, the tags must be made compact, usually are thin and flexible, and should be inexpensive enough to be readily expendable.

2. Description of Related Art

The circuitry of an RFID tag includes an antenna connected to other circuit components of the tag. The antenna typically occupies a substantial portion of the area dimensions of the tag and usually is constructed of a relatively thin copper foil for flexibility and for maximum effectiveness in responding to RF signals. Current manufacturing processes are similar to those employed in the manufacture of printed circuit boards. A thin copper foil, typically 0.0005 to 0.0015 inch in thickness, is laminated to a flexible synthetic polymeric substrate, such as a PET (polyethylene terephthalate) substrate having a thickness of about two to five mils. The desired antenna configuration then is photochemically etched from the laminate, that is, copper is chemically milled away leaving the desired copper pattern laminated to the chemically inert substrate. The substantial cost of the copper/PET laminate coupled with the relatively high cost of processing the substrate by chemical etching results in a total cost which becomes excessive when viewed in the light of the increasing demand for inexpensive, readily expendable RFID tags.

BRIEF SUMMARY OF THE INVENTION

The present invention provides improvements in manufacturing processes and in intermediate products which facilitate the manufacture of highly effective, yet relatively inexpensive RFID tags for widespread use in connection with the management of inventories and sales of a wide variety of goods.

In summary, rather than chemically etching a desired antenna configuration from a copper foil laminated to a synthetic polymeric substrate, the antenna configuration is stamped from a thin sheet of copper or aluminum and subsequently is affixed to a substrate to establish an intermediate product used to complete an RFID tag, all as described in an earlier filed patent application, Ser. No. 11/075,390, filed Mar. 8, 2005, the disclosure of which is incorporated herein by reference thereto. The ability to employ an antenna stamped from a thin metallic sheet enables the elimination of a relatively expensive laminated substrate starting material as well as the conventional costly manufacturing protocols associated with a chemical etching procedure.

The manufacture of an RFID tag requires that an electrical connection be made between the antenna and an electronic component, such as an RFID integrated circuit (IC) chip (also referred to as a "die") or a capacitor, within the RFID tag. The employment of a stamped copper or aluminum antenna, as described above, enables the connection between the electronic component and the antenna to be made readily by soldering. Solder connections are preferred in that corrosion is eliminated and the shortcomings of various mechanical connections are avoided. Mechanical connections can fail as a result of flexing of the RFID tag, and concomitant flexing of the antenna.

The stamped antenna enables the leads of an electronic component to be soldered to the antenna. Such a soldered connection not only provides the desired positive electrical connection, but enables economy of assembly in that the connection can be made prior to affixation of the antenna to the substrate, as described in the aforesaid provisional patent application Ser. No. 11/075,390.

A manufacturing process in which an electronic component, such as an RFID IC chip, can be soldered to each antenna and which enables higher speed production of the RFID tag in a sequential line requires the ability to locate the electronic component in accurately placed juxtaposition with each sequential antenna in a line so that the leads of the electronic component are precisely registered with contact areas of the antenna, and soldered, all before affixation of the antennas to a substrate. The ability to make the electrical connection before affixation of the antenna to the substrate allows the use of the more desirable soldered connections without applying heat to the substrate, which otherwise could degrade or damage the substrate. Furthermore, having the ability to stamp the antenna and make the soldered connections within a sequential line enables the incorporation of additional assembly procedures in that same line so as to realize further economy of manufacture. For example, the addition of the backing and the cover of a completed RFID tag can be accomplished within one continuous sequential line.

Thus, the present invention attains several objects and advantages, some of which are summarized as follows: Facilitates the manufacture of RFID tags having antennas stamped from thin metal sheets and connected to electronic components with soldered connections; enables the placement and assembly of electronic components with antennas to be accomplished quickly and with precision for more economical and higher speed production of RFID tags; allows greater flexibility in the selection and use of facilities at manufacturing sites enabling a wider variety of choices of manufacturing sites; avoids the use of relatively expensive materials, techniques, equipment and facilities associated with current manufacturing procedures which require chemical etching; gains the advantages of soldered connections and the concomitant mechanical and electrical integrity provided by soldered connections; eliminates the requirement for complex and costly facilities and procedures in the production of RFID tags, allowing greater flexibility and higher efficiency in the arrangement and citing of production lines for maximum economy in the distribution and use of RFID tags; enables high-speed, automated production of RFID tags having stamped antennas with soldered connections; provides RFID tags of higher quality at lower cost, for promoting widespread use of RFID tags with increased reliability and greater economy.

The above objects and advantages, as well as further objects and advantages, are attained by the present invention which may be described briefly as providing, in the manufacture of an RFID tag, a method for electrically connecting leads of an electronic component to counterpart contact areas of an antenna stamped from a thin strip of electrically conductive metal, the method comprising: stamping portions from the thin strip of metal to establish a contact member and a compliant coupling arrangement coupling the contact member with the strip for compliant movement of the contact member relative to the strip, the contact member having contact areas; providing solder at each contact area; juxtaposing the electronic component with the contact member, with the compliant coupling arrangement enabling compliant movement of the contact member and placement of the contact member and the electronic component in a predetermined relative position wherein the leads of the electronic component are registered with solder on a counterpart contact area of the contact member; and fusing the solder to effect a soldered connection between each lead and the counterpart contact area.

In addition, the present invention includes, in the manufacture of RFID tags, a method for electrically connecting leads of electronic components to counterpart contact areas of antennas stamped sequentially from a thin strip of electrically conductive metal of indeterminate longitudinal length, the method comprising: sequentially stamping portions from the thin strip of metal to establish a series of contact members spaced longitudinally from one another along the strip, and corresponding compliant coupling arrangements coupling the contact members with the strip for compliant movement of the contact members relative to the strip, the contact members having contact areas; providing solder at each contact area; juxtaposing an electronic component with a corresponding contact member at a transfer station, with the compliant coupling arrangement enabling compliant movement of the contact member and placement of the contact member and the corresponding electronic component in a predetermined relative position wherein the leads of the electronic component are registered with solder on counterpart contact areas of the contact member; and fusing the solder to effect a soldered connection between each lead and the counterpart contact area.

Further, the present invention provides an intermediate product for the manufacture of RFID tags, each RFID tag including an electronic component electrically connected to an antenna stamped from a thin strip of electrically conductive metal, the intermediate product comprising: a thin strip of conductive metal of indeterminate longitudinal length; a series of contact members spaced longitudinally along the strip, the contact members being carried by the strip for movement with the strip into and out of a manufacturing station upon movement of the strip in a longitudinal direction, each contact member including an overall contact area and contact elements having corresponding contact areas; and a compliant coupling arrangement coupling each contact member with the strip for enabling compliant movement of a contact member relative to the strip for enabling alignment of the contact member and an electrical component in a predetermined relative position at the manufacturing station.

Further, the present invention includes an intermediate product for the manufacture of RFID tags, each RFID tag including an electronic component electrically connected to an antenna stamped from a thin strip of electrically conductive metal, the intermediate product comprising: a substrate of indeterminate longitudinal length; a series of antennas stamped from a thin strip of electrically conductive metal and placed longitudinally along the substrate, the antennas being spaced longitudinally from one another along a longitudinal direction; each antenna including contact elements; and an electronic component connected to each antenna, each electronic component having leads registered with and soldered to corresponding contact elements of a corresponding antenna.

BRIEF DESCRIPTION OF THE SEVERAL VIEWS OF THE DRAWING

The present invention will be understood more fully, while still further objects and advantages will become apparent, in the following detailed description of preferred embodiments of the invention illustrated in the accompanying drawing, in which:

FIG. 2 is an enlarged portion of FIG. 1;

FIG. 2A is a further enlarged portion of FIG. 2, taken at arrow 2A of FIG. 2;

FIG. 2B is an enlarged cross-sectional view, taken along line 2B-2B of FIG. 2;

FIG. 3 is another enlarged portion of FIG. 1;

FIG. 3A is a further enlarged portion of FIG. 3, taken at arrow 3A of FIG. 3;

FIG. 3B is an enlarged cross-sectional view, taken along line 3B-3B of FIG. 3;

FIG. 3C is an enlarged bottom plan view of an electronic component illustrated in connection with the present invention;

FIG. 4 is still another enlarged portion of FIG. 1;

FIG. 4A is a further enlarged portion of FIG. 4, taken at arrow 4A of FIG. 4; and FIG. 4B is an enlarged cross-sectional view, taken along line 4B-4B of FIG. 4.

DETAILED DESCRIPTION OF THE INVENTION

Figure 1:
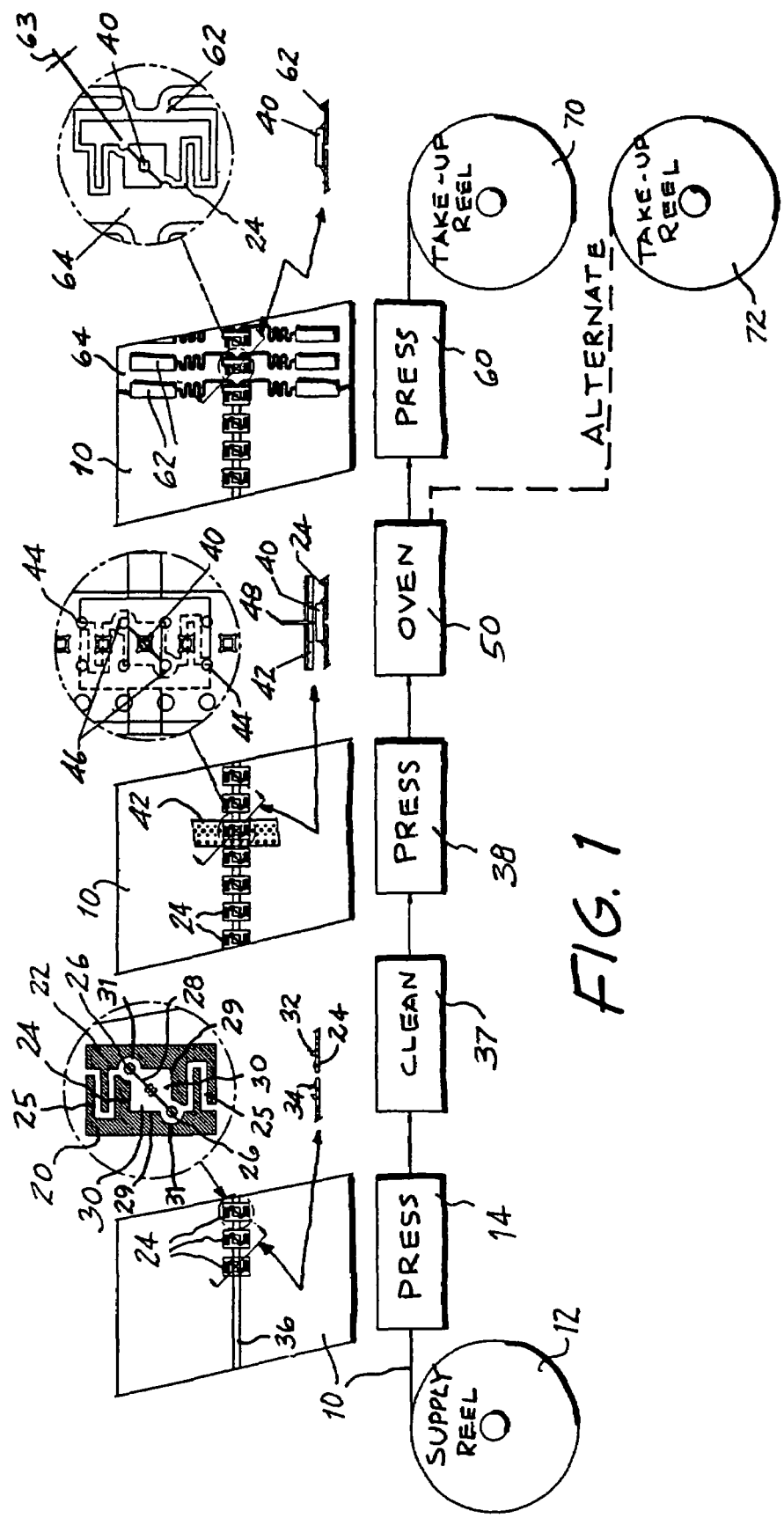
FIG. 1 is a diagrammatic illustration, with several magnified insets, of a sequential line demonstrating an embodiment of the present invention.

Referring now to the drawing, and especially to FIG. 1 thereof, a sequential line is illustrated in which an aluminum strip 10 is supplied from a supply reel 12 and advanced along a longitudinal direction to a first press 14 where portions of the strip 10 are punched from the strip 10, as represented by shaded areas 20 and 22, to establish a series of contact members 24 integrated with and carried by the remainder of the strip 10, spaced longitudinally from one another along the strip 10, each contact member 24 remaining coupled with the strip 10 by a compliant coupling arrangement shown in the form of undulant arms 25 connecting each contact member 24 with the strip 10.

Locators in the form of pilot holes 26 are placed at the opposite ends of a slot 28 which separates each contact member 24 into two contact elements 29 such that the overall area of each contact member 24 is divided into two separate contact areas 30. The pilot holes 26 extend altitudinally through ears 31 formed unitary with the contact member 24 so that the two separate contact elements 29 are joined by the ears 31, for purposes to be described below. In the preferred arrangement, the overall area of each contact member 24 is provided with an essentially rectangular configuration and slot 28 extends along a diagonal of the rectangular area, oblique to the longitudinal spacing of the contact members 24 along strip 10, for reasons to be set forth hereinafter. At the same time, portions of the strip 10 at the contact areas 30 are deformed, as by lancing, to provide four containing shoulders 32 in each contact member 24 and are further deformed to provide a contact dimple 34 in each separate contact area 30, all as seen better in FIGS. 2 through 2B. The aluminum strip 10 carries solder, shown in the form of a copper clad silver solder inlay 36, which is integrated with and extends longitudinally along the strip 10, and the contact members 24 are placed along the strip 10 such that the contact areas 30 are juxtaposed with the solder provided by solder inlay 36.

The strip 10 then is cleaned at station 37 and advanced to a second press 38 located at another manufacturing station, in the form of transfer station 39, wherein, as best seen in FIGS. 3 through 3C, an electronic component, illustrated as a chip 40 having leads 41, is juxtaposed with and placed on each contact member 24, located accurately upon the contact member 24, with the leads 41 of the chip 40 registered with corresponding contact dimples 34 of the contact areas 30, and registered with the solder provided at the contact areas 30. Chip 40 is illustrated in the form of a conventional RFID IC chip having a generally rectangular plan configuration with leads 41 located essentially along a diagonal of the rectangular configuration, diagonally opposite one another, as seen FIG. 3C. The chips 40 are brought sequentially into juxtaposition with the strip 10 by a transfer tape 42 which is advanced along a path of travel transverse to the path of travel of the strip 10 and into the transfer station 39 in synchronism with the advancement of strip 10. In the illustrated preferred arrangement, suitable for high-speed, automated production, the path of travel of the transfer tape 42 is essentially normal to the path of travel of the strip 10. Accordingly, upon juxtaposition of a chip 40 with a contact member 24, at the transfer station 39, the diagonally opposite location of leads 41 places each lead 41 well within the triangular configuration of a corresponding contact area 30 for assuring an effective soldered connection, as described below.

Transfer tape 42 includes locators in the form of pilot holes 44 which are to be aligned with pilot holes 26 within a corresponding contact member 24 so that chip-locating pilots 46 extended through registered pilot holes 44 and 26 accurately locate a chip 40 relative to contact areas 30 of a corresponding contact member 24 at the transfer station 39. The compliant coupling arrangement provided by undulant arms 25 enables movement of the contact member 24, in longitudinal and lateral directions relative to the strip 10, in response to the insertion of pilots 46, as may be required to place the contact member 24 and the chip 40 in appropriate alignment at a predetermined relative position wherein the leads 41 of the chip 40 are registered with the corresponding contact dimples 34 and the solder provided at the contact dimples 34. Insertion of pilots 46 through pilot holes 26 and 44 will pass the pilots 46 through counterpart ears 31 to effect any necessary movement of the contact member 24 as a whole, since the ears 31 straddle the slot 28 of the contact member 24 to maintain the contact member 24 in one piece. An ejector pin 48 then moves the chip 40 from the transfer tape 42 to the contact member 24, carried by the strip 10, where the chip 40 is confined and held accurately in place by the surrounding containing shoulders 32 for advancement with strip 10.

Strip 10, with chips 40 carried in accurate registration with corresponding contact areas 30 of contact members 24, is advanced into an oven 50 wherein the solder at each contact area 30 is fused so that the leads 41 of each chip 40 are soldered to corresponding contact areas 30, at corresponding contact dimples 34, of the contact members 24. Alternate apparatus may be employed to fuse the solder at each contact area 30.

Strip 10 then is advanced to a third press 60 wherein, as best seen in FIGS. 4 through 4B, antennas 62 are stamped sequentially from the strip 10, with each antenna 62 being formed unitary with a contact member 24 such that each antenna 62 carries a chip 40 having leads 41 soldered to the antenna 62 at contact dimples 34 of corresponding contact areas 30 of the contact elements 29, which contact elements 29 now serve as antenna contacts. The contact areas 30 are separated by a gap 63 established by slot 28, the ears 31 having been severed from the contact member 24 during stamping of each antenna 62, so that the contact elements 29, and the contact areas 30 thereof, no longer are connected electrically through the ears 31. At the same time, the antennas 62, now separated from the remainder of strip 10, can be transferred to a substrate 64 and carried for further assembly to complete the manufacture of RFID tags, in which case the substrate 64, with the antennas 62, is transferred to a take-up reel 70 for further processing. Thus, the connections between the leads 41 of chip 40 and corresponding contact areas 30 are soldered well prior to placing completed antennas 62 on substrate 64, thereby avoiding any degradation of the substrate which otherwise could result from the heat of the soldering operation.

As an alternate, upon leaving oven 50, strip 10 may be directed to a take-up reel 72, as illustrated in FIG. 1, for transfer to a remote press (not shown) to complete the antennas 62 and the further manufacture of complete RFID tags.

It will be seen that the present invention attains all of the objects and advantages summarized above, namely: Facilitates the manufacture of RFID tags having antennas stamped from thin metal sheets and connected to electronic components with soldered connections; enables the placement and assembly of electronic components with antennas to be accomplished quickly and with precision for more economical and higher speed production of RFID tags; allows greater flexibility in the selection and use of facilities at manufacturing sites enabling a wider variety of choices of manufacturing sites; avoids the use of relatively expensive materials, techniques, equipment and facilities associated with current manufacturing procedures which require chemical etching; gains the advantages of soldered connections and the concomitant mechanical and electrical integrity provided by soldered connections; eliminates the requirement for complex and costly facilities and procedures in the production of RFID tags, allowing greater flexibility and higher efficiency in the arrangement and citing of production lines for maximum economy in the distribution and use of RFID tags; enables high-speed, automated production of RFID tags having stamped antennas with soldered connections; provides RFID tags of higher quality at lower cost, for promoting widespread use of RFID tags with increased reliability and greater economy.

It is to be understood that the above detailed description of preferred embodiments of the invention are provided by way of example only. Various details of design, construction and procedure may be modified without departing from the true spirit and scope of the invention, as set forth in the appended claims.

The embodiments of the invention in which an exclusive property or privilege is claimed are defined as follows:

1. In the manufacture of an REID tag, a method for electrically connecting leads of an electronic component to counterpart contact areas of an antenna stamped from a thin strip of electrically conductive metal, the method comprising:

stamping portions from the thin strip of metal to establish a contact member and a compliant coupling arrangement coupling the contact member with the strip for compliant movement of the contact member relative to the strip, the contact member having contact areas;

providing solder at each contact area;

juxtaposing the electronic component with the contact member, with the compliant coupling arrangement enabling compliant movement of the contact member for placement of the contact member and the electronic component in a predetermined relative position wherein the leads of the electronic component are registered with solder on a counterpart contact area of the contact member;

providing a locator on the contact member and subsequently engaging the locator to move the contact member into the predetermined relative position; and fusing the solder to effect a soldered connection between each lead and the counterpart contact area.

2. The method of claim 1 including stamping a slot between the contact areas of the contact member prior to juxtaposing the electronic component with the contact member.

3. The method of claim 2 wherein the contact areas of the contact member extend over an essentially rectangular area and the slot extends along a diagonal of the rectangular area such that each contact area comprises a generally triangular area.

4. The method of claim 1 wherein the solder is provided at each contact area by providing the strip with solder integrated with the strip prior to stamping the portions from the strip, the solder being placed on the strip for subsequent location of solder at each contact area.

5. The method of claim 1 further including forming shoulders in the contact member prior to juxtaposing the electronic component with the contact member, the shoulders being located for confining the electronic component to the predetermined relative position prior to fusing the solder.

6. The method of claim 1 further including forming a contact dimple in a corresponding contact area prior to juxtaposing the electronic component with the contact member, the contact dimple being located such that a counterpart lead of the electronic component is registered with the contact dimple when the contact member and the electronic component are in the predetermined relative position.

7. The method of claim 1 further including subsequently severing the contact member from the strip, and separating the contact areas from one another.

8. The method of claim 7 including stamping a completed antenna from the strip, with the contact member integral with the antenna, and the leads of the electronic component soldered to respective contact areas of the contact member.

9. In the manufacture of RFID tags, a method for electrically connecting leads of electronic components to counterpart contact areas of antennas stamped sequentially from a thin strip of electrically conductive metal of indeterminate longitudinal length, the method comprising:

sequentially stamping portions from the thin strip of metal to establish a series of contact members spaced longitudinally from one another along the strip, and corresponding compliant coupling arrangements coupling the contact members with the strip for compliant movement of the contact members relative to the strip, the contact members having contact areas;

providing solder at each contact area;

juxtaposing an electronic component with a corresponding contact member at a transfer station, with the compliant coupling arrangement enabling compliant movement of the contact member for placement of the contact member and the corresponding electronic component in a predetermined relative position wherein the leads of the electronic component are registered with solder on counterpart contact areas of the contact member;

providing a locator on each contact member and subsequently engaging the locator of the contact member at the transfer station to move the contact member into the predetermined relative position; and fusing the solder to effect a soldered connection between each lead and the counterpart contact area.

10. The method of claim 9 including providing at least a first locator on each contact member and wherein each contact member is delivered sequentially to the transfer station, each electronic component is delivered sequentially to the transfer station, in synchronism with the delivery of a corresponding contact member, by means of a transfer tape having at least a second locator corresponding to each first locator such that upon alignment of corresponding first and second locators at the transfer station, a contact member and a corresponding electronic component are placed accurately at the predetermined relative position.

11. The method of claim 10 wherein the first and second locators comprise first and second pilot holes in the strip and in the transfer tape, respectively, such that alignment of the corresponding first and second locators is accomplished by inserting a pilot into juxtaposed first and second pilot holes at the transfer station.

12. The method of claim 9 including stamping a slot between the contact areas of each contact member prior to juxtaposing a corresponding electronic component with the contact member.

13. The method of claim 12 wherein the contact areas of each contact member extend over an essentially rectangular area and the slot extends along a diagonal of the rectangular area such that each contact area comprises a generally triangular area.

14. The method of claim 9 wherein the solder is provided at each contact area by providing the strip with solder integrated with the strip prior to stamping the portions from the strip, the solder being placed on the strip for subsequent location of solder at each contact area.

15. The method of claim 9 further including forming shoulders in each contact member prior to juxtaposing an electronic component with a corresponding contact member, the shoulders being located for confining the electronic component to the predetermined relative position prior to fusing the solder.

16. The method of claim 9 further including forming a contact dimple in a corresponding contact area prior to juxtaposing an electronic component with a corresponding contact member, the contact dimple being located such that a counterpart lead of the electronic component is registered with the contact dimple when the contact member and the electronic component are in the predetermined relative position.

17. The method of claim 9 further including subsequently severing each contact member from the strip, and separating the contact areas of each severed contact member from one another.

18. The method of claim 17 including sequentially stamping completed antennas from the strip, with a corresponding contact member integral with each completed antenna, and the leads of a corresponding electronic component soldered to respective contact areas of the corresponding contact member.

19. An intermediate product for the manufacture of RFID tags, each RFID tag including an electronic component electrically connected to an antenna stamped from a thin strip of electrically conductive metal, the intermediate product comprising:

a thin strip of conductive metal of indeterminate longitudinal length;

a series of contact members spaced longitudinally along the strip, the contact members being carried by the strip fox movement with the strip into and out of a manufacturing station upon movement of the strip in a longitudinal direction, each contact member including an overall contact area and contact elements having corresponding contact areas; and a compliant coupling arrangement coupling each contact member with the strip for enabling compliant movement of a contact member relative to the strip for enabling alignment of the contact member and an electrical component in a predetermined relative position at the manufacturing station; and at least one locator on each contact member for engagement to effect compliant movement of each contact member into the predetermined relative position.

20. The intermediate product of claim 19 wherein each compliant coupling arrangement comprises undulated arms unitary with and extending between the strip and a corresponding contact member.

21. The intermediate product of claim 19 including solder integrated with each contact member at corresponding contact areas.

22. The intermediate product of claim 19 wherein the one locator comprises a pilot hole for being engaged by a pilot at the manufacturing station.

23. The intermediate product of claim 19 wherein each contact member includes a narrow gap, relative to the contact areas of the contact elements, the narrow gap dividing the overall contact area into the contact areas of the contact elements.

24. The intermediate product of claim 23 wherein the overall contact area of each contact member extends over an essentially rectangular area, and the gap extends along a diagonal of the rectangular area such that the contact area of each contact element comprises a generally triangular area.

25. The intermediate product of claim 24 wherein the diagonal is oriented oblique to the longitudinal spacing of the contact members along the strip.

26. The intermediate product of claim 19 including shoulders in each contact member, the shoulders being located for confining a corresponding electronic component to the predetermined relative position.

27. The intermediate product of claim 19 including a contact dimple in each corresponding contact area, the contact dimple being located such that a counterpart lead of a corresponding electronic component will be registered with the contact dimple.

28. The intermediate product of claim 19 including an electronic component juxtaposed with each contact member, each electronic component having leads registered with and soldered to Corresponding contact elements of a juxtaposed contact member.

29. In the manufacture of an electronic device, a method for electrically connecting leads of an electronic component to counterpart contact areas of an antenna stamped from a thin strip of electrically Conductive metal, the method comprising:

stamping portions from the thin strip of metal to establish a contact member and a compliant coupling arrangement coupling the contact member with the strip for compliant movement of the contact member relative to the strip, the contact member having contact areas;

providing solder at each contact area;

juxtaposing the electronic component with the contact member, with the compliant coupling arrangement enabling compliant movement of the contact member for placement of the contact member and the electronic component in a predetermined relative position wherein the leads of the electronic component are registered with solder on a counterpart contact area of the contact member;

providing a locator on the contact member and subsequently engaging the locator to move the contact member into the predetermined relative position: and fusing the solder to effect a soldered connection between each lead and the counterpart contact area.

30. The method of claim 29 including stamping a slot between the contact areas of the contact member prior to juxtaposing the electronic component with the contact member.

31. The method of claim 30 wherein the contact areas of the contact member extend over an essentially rectangular area and the slot extends along a diagonal of the rectangular area such that each contact area comprises a generally triangular area.

32. The method of claim 29 wherein the solder is provided at each contact area by providing the strip with solder integrated with the strip prior to stamping the portions from the strip, the solder being placed on the strip for subsequent location of solder at each contact area.

33. The method of claim 29 further including forming shoulders in the contact member prior to juxtaposing the electronic component with the contact member, the shoulders being located for confining the electronic component to the predetermined relative position prior to fusing the solder.

34. The method of claim 29 further including forming a contact dimple in a corresponding contact area prior to juxtaposing the electronic component with the contact member, the contact dimple being located such that a counterpart lead of the electronic component is registered with the contact dimple when the contact member and the electronic component are in the predetermined relative position.

35. The method of claim 29 further including subsequently severing the contact member from the strip, and separating the contact areas from one another.

36. The method of claim 35 including stamping a completed antenna from the strip, with the contact member integral with the antenna, and the leads of the electronic component soldered to respective contact areas of the contact member.

37. In the manufacture of electronic devices, a method for electrically connecting leads of electronic components to counterpart contact areas of antennas stamped sequentially from a thin strip of electrically conductive metal of indeterminate longitudinal length, the method comprising:

sequentially stamping portions from the thin strip of metal to establish a series of contact members spaced longitudinally from one another along the strip, and corresponding compliant coupling arrangements coupling the contact members with the strip for compliant movement of the contact members relative to the strip, the contact members having contact areas;

providing solder at each contact area;

juxtaposing an electronic component with a corresponding contact member at a transfer station, with the compliant coupling arrangement enabling compliant movement of the contact member for placement of the contact member and the corresponding electronic component in a predetermined relative position wherein the leads of the electronic component are registered with solder on counterpart contact areas of the contact member;

providing a locator on each contact member and subsequently engaging the locator of the contact member at the transfer station to move the contact member into the predetermined relative position; and fusing the solder to effect a soldered connection between each lead and the counterpart contact area.

38. The method of claim 37 including providing at least a first locator on each contact member and wherein each contact member is delivered sequentially to the transfer station, each electronic component is delivered sequentially to the transfer station, in synchronism with the delivery of a corresponding contact member, by means of a transfer tape having at least a second locator corresponding to each first locator such that upon alignment of corresponding first and second locators at the transfer station, a contact member and a corresponding electronic component are placed accurately at the predetermined relative position.

39. The method of claim 38 wherein the first and second locators comprise first and second pilot holes in the strip and in the transfer tape, respectively, such that alignment of the corresponding first and second locators is accomplished by inserting a pilot into juxtaposed first and second pilot holes at the transfer station.

40. The method of claim 37 including stamping a slot between the contact areas of each contact member prior to juxtaposing a corresponding electronic component with the contact member.

41. The method of claim 40 wherein the contact areas of each contact member extend over an essentially rectangular area and the slot extends along a diagonal of the rectangular area such that each contact area comprises a generally triangular area.

42. The method of claim 37 wherein the solder is provided at each contact area by providing the strip with solder integrated with the strip prior to stamping the portions from the strip, the solder being placed on the strip for subsequent location of solder at each contact area.

43. The method of claim 37 further including forming shoulders in each contact member prior to juxtaposing an electronic component with a corresponding contact member, the shoulders being located for confining the electronic component to the predetermined relative position prior to fusing the solder.

44. The method of claim 37 further including forming a contact dimple in a corresponding contact area prior to juxtaposing an electronic component with a corresponding contact member, the contact dimple being located such that a counterpart lead of the electronic component is registered with the contact dimple when the contact member and the electronic component are in the predetermined relative position.

45. The method of claim 37 further including subsequently severing each contact member from the strip, and separating the contact areas of each severed contact member from one another.

46. The method of claim 45 including sequentially stamping completed antennas from the strip, with a corresponding contact member integral with each completed antenna, and the leads of a corresponding electronic component soldered to respective contact areas of the corresponding contact member.

47. An intermediate product for the manufacture of electronic devices, each electronic device including an electronic component electrically connected to an antenna stamped from a thin strip of electrically conductive metal, the intermediate product comprising:

a thin strip of conductive metal of indeterminate longitudinal length;

a series of contact members spaced longitudinally along the strip, the contact members being carried by the strip for movement with the strip into and out of a manufacturing station upon movement of the strip in a longitudinal direction, each contact member including an overall contact area and contact elements having corresponding contact areas; and a compliant coupling arrangement coupling each contact member with the strip for enabling compliant movement of a contact member relative to the strip for enabling alignment of the contact member and an electrical component in a predetermined relative position at the manufacturing station; and at least one locator on each contact member for engagement to effect compliant movement of each contact member into the predetermined relative position.

48. The intermediate product of claim 47 wherein each compliant coupling arrangement comprises undulated arms unitary with and extending between the strip and a corresponding contact member.

49. The intermediate product of claim 47 including solder integrated with each contact member at corresponding contact areas.

50. The intermediate product of claim 47 wherein the one locator comprises a pilot hole for being engaged by a pilot at the manufacturing station.

51. The intermediate product of claim 47 wherein each contact member includes a narrow gap, relative to the contact areas of the contact elements, the narrow gap dividing the overall contact area into the contact areas of the contact elements.

52. The intermediate product of claim 51 wherein the overall contact area of each contact member extends over an essentially rectangular area, and the gap extends along a diagonal of the rectangular area such that the contact area of each contact element comprises a generally triangular area.

53. The intermediate product of claim 52 wherein the diagonal is oriented oblique to the longitudinal spacing of the contact members along the strip.

54. The intermediate product of claim 47 including shoulders in each contact member, the shoulders being located for confining a corresponding electronic component to the predetermined relative position.

55. The intermediate product of claim 47 including a contact dimple in each corresponding contact area, the contact dimple being located such that a counterpart lead of a corresponding electronic component will be registered with the contact dimple.

56. The intermediate product of claim 47 including an electronic component juxtaposed with each contact member, each electronic component having leads registered with and soldered to corresponding contact elements of a juxtaposed contact member.

* * * * *